United States Patent [19]

Nishiura

[11] Patent Number: 4,689,874
[45] Date of Patent: Sep. 1, 1987

[54] PROCESS FOR FABRICATING A THIN-FILM SOLAR BATTERY

[75] Inventor: Masaharu Nishiura, Kanagawa, Japan

[73] Assignee: Fuji Electric Company, Ltd., Kanagawa, Japan

[21] Appl. No.: 863,426

[22] Filed: May 15, 1986

[30] Foreign Application Priority Data

May 16, 1985 [JP] Japan .................................. 60-104375

[51] Int. Cl.$^4$ ...................... H01L 31/18; H01L 27/14
[52] U.S. Cl. ........................................ 437/2; 136/244; 136/258; 437/7; 437/226; 437/181
[58] Field of Search .......................... 29/572, 583, 591; 136/244, 258 AM; 219/121 LJ, 121 LN

[56] References Cited

U.S. PATENT DOCUMENTS 4,594,471   6/1986   Yamazaki ............................ 136/249

OTHER PUBLICATIONS

S. Yamazaki et al., Chapter 4.3, "Laser Scribing Lithography", in *JARECT*, vol. 16, Amorphous Semiconductor Technologies and Devices (1984), Y. Hamakawa, Editor, North Holland Pub. Co., 1984, pp. 149–167.

*Primary Examiner*—Aaron Weisstuch
*Attorney, Agent, or Firm*—Finnegan, Henderson, Farabow, Garrett and Dunner

[57] ABSTRACT

A process for fabricating a thin-film solar battery is provided having one or more unit cells each having a thin-film semiconductor active region formed over a transparent dielectric substrate and being in contact with a transparent electrode on the substrate side and with a metal electrode on the opposite side. Layers of a transparent conductive film, a semiconductor film, and a metal film are successively formed over the substrate and each other, and the respective films are successively scribed by a laser to form separate, related layers which in turn form the cells. An opaque layer is formed on a portion of the substrate remote from the cells, is scribed by a laser, and serves as a marker so the substrate can be properly aligned during the scribing steps.

6 Claims, 13 Drawing Figures

PROCESS FOR FABRICATING A THIN-FILM SOLAR BATTERY

BACKGROUND OF THE INVENTION

The present invention relates to a process for fabricating a thin-film solar battery comprising a transparent dielectric substrate which carries a patterned thin semiconductor film sandwiched between patterned electrode layers.

Most thin-film solar batteries available today comprise series-connected unit cells. FIG. 1 shows a typical example of such solar batteries. More specifically, FIG. 1(a) is a plan view of a typical example of such a battery and FIG. 1(b) is a cross-sectional view looking in the direction of the arrow X.

FIG. 1 illustrates transparent dielectric substrate 1, usually in the form of a glass plate, carrying three transparent electrodes 21, 22, and 23, each being made of a film of indium tin oxide (ITO), $SnO_2$, or a laminate of these two materials. the electrodes are formed by first depositing an appropriate transparent conductive film over the entire surface of the substrate 1 by electrode-beam evaporation or sputtering and then working the deposited layer in accordance with photolithographic processes to form patterns as delineated by the dashed lines in FIG. 1(a).

Then, three regions 31, 32, and 33 of a pin-junction type amorphous silicon (hereinafter abbreviated as a-Si) layer are formed on the transparent electrodes 21, 22, and 23, respectively, by the following procedures. First, the a-Si layer comprising a p-type layer about 100 Å thick, an intrinsic layer about 0.5 $\mu$m thick, and an n-type layer about 500 Å thick are deposited over the entire surface of the substrate 1 so as to cover the transparent electrodes 21, 22, and 23. Then, the deposited a-Si layer is worked by photolithographic techniques to form patterns as delineated by the solid lines in FIG. 1(a). The patterns of the regions 31, 32, and 33 are similar to those of the transparent electrodes 21, 22, and 23 but are slightly displaced from the latter in the same direction (rightward in FIG. 1) so that the transparent electrodes 21, 22, and 23 are partly exposed.

In a similar manner, a thin metal film is deposited over the entire surface of the substrate by evaporation or any other suitable technique, and the deposited layer is patterned by photolithographic processes to form metal electrodes 44, 41, 42, and 43. In FIG. 1(a), the patterns of the electrodes are delineated by one-short-and-one-long dashed lines and hatched to emphasize their presence. If such patterned metal films, which are usually made of aluminum, are formed by etching with an acid such as phosphoric acid, nitric acid, or a mixed acid, nascent hydrogen will evolve and may etch not only the metal layer but also the underlying transparent electrodes. In order to avoid this problem, the acid etching may be replaced by plasma etching using a gaseous etchant such as $Cl_2$, $BCl_3$, or $CCl_4$. As a consequence of the above procedures, the metal electrodes 44, 41, and 42 are contacted with the transparent electrodes 21, 22, and 23, respectively, and a thin-film solar battery is formed of unit cell 11, unit cell 12, and unit cell 13 which are connected in series. Unit cell 11 comprises the transparent electrode 21, a-Si layer 31, and metal electrode 41; unit cell 12 comprises the transparent electrode 22, a-Si layer 32, and metal electrode 42; and unit cell 13 comprises the transparent electrode 23, a-Si layer 33, and metal electrode 43.

The above fabrication process presents several disadvantages. First, patterning the transparent conductive film, a-Si layer, and metallic film by photolithographic procedures requires that the application and drying of photoresist films be effected in the batch process. In addition, as the area of the solar cell increases, the size and cost of the equipment necessary to permit a liquid photoresist to be uniformly applied and to perform exposure and post-bake with a photomask increase, with the attendant increases in the cost of the photomask.

In view of these problems, it has been proposed that patterning for providing transparent electrodes, a-Si regions, and metal electrodes be carried out by scribing with a laser beam. Laser scribing eliminates the application of a photoresist and the use of a photomask, and allows a large solar battery to be formed on a single substrate by continuous working. However, the laser beam is only capable of linear scribing. Therefore, substantial time and efforts are required for removing the transparent conductive film, the a-Si layer, and the metallic film from the entire surface of the region that surrounds the solar battery as indicated by numeral 10 in FIG. 1. The a-Si layer in the peripheral portion 10 is highly sensitive to the formation of defects which must be eliminated in order to avoid charge leakage between the transparent electrode and the metal electrode. In addition, markers must be formed in the peripheral region to ensure that the individual layers are correctly positioned during patterning by a laser beam. This problem requires that a special step be carried out to form opaque markers precisely at predetermined positions on the transparent substrate. As an alternative, a method has been used wherein the edges of the substrate are brought into alignment with those of the individual layers to be deposited. However, in the absence of any marker, the patterns often are not precisely aligned and shorting sometimes occurs between the transparent electrode and the metal electrode. This shorting obviously impairs the characteristics of the device.

SUMMARY OF THE INVENTION

The present invention is directed to an improvement in the formation of one or more adjacent unit solar cells having a thin semiconductor film between electrode layers. The present invention provides a method of laser-scribing a transparent conductive film, a thin semiconductor film, and a metallic film after they are successively deposited on the entire surface of a transparent dielectric substrate. One object of the invention is to eliminate the need for removing the deposited transparent conductive film, semiconductor film, and metallic film from the entire surface of the area which surrounds the circuit cells. Another object is to allow markers to be readily formed to provide an index for the positioning of the individual forms during laser scribing.

Additional objects and advantages of the invention will be set forth in part of the description which follows, and in part will be obvious from the description, or may be learned by the practice of the invention. The object and advantages of the invention will be realized and attained by the elements and combinations particularly pointed out in the appended claims.

The present invention basically relates to a process for fabricating a thin-film solar battery by forming one or more unit cells each having a thin-film semiconductor active region that is formed on a transparent electrode on the substrate side and with a metal electrode on the opposite side. To achieve the objects and in accordance with the above-stated objects and purpose of the invention, as embodied and broadly described herein, the process of the present invention comprises the steps of depositing a transparent conductive film over one surface of the substrate; forming an opaque film over a portion of the combined substrate and deposited transparent conductive film remote from the area where the unit cells are to be formed; scribing with a laser beam the deposited transparent conductive film down to the substrate to form from the transparent conductive film inward from said opaque film separate transparent electrodes for the respective unit cells; removing selected portions of the opaque area with a laser beam to form light-transmitting markers; depositing a semiconductor film over the separate transparent electrodes and the surface of the substrate surrounding the electrodes, but not in the area where the markers are formed; placing the substrate into proper alignment with the aid of the markers; scribing with a laser beam the deposited semiconductor film down to the transparent conductive film to form from the semiconductor film separate active regions for the respective unit cells; depositing a metal film over the separate active regions and the surface of the transparent conductive film surrounding the separate active regions, but not in the area where the markers are formed; placing the substrate into proper alignment with the aid of the markers; and scribing with a laser beam the deposited metal film down to the semiconductor film to form from the metal film separate metal electrodes for the respective unit cells.

It is to be understood that both the foregoing general description and the following detailed description are exemplary and explanatory only and are not restrictive of the invention as claimed.

The accompanying drawings, which are incorporated in and constitute a part of this specification, illustrate an embodiment of the invention and together with the description, serve to explain the principles of the invention.

BRIEF DESCRIPTION OF THE DRAWINGS

FIG. 1 shows a conventional thin-film solar battery, wherein

FIG. 2 shows a thin-film solar battery fabricated by one embodiment of the present invention, wherein

DESCRIPTION OF THE PREFERRED EMBODIMENTS

Figure 1A:
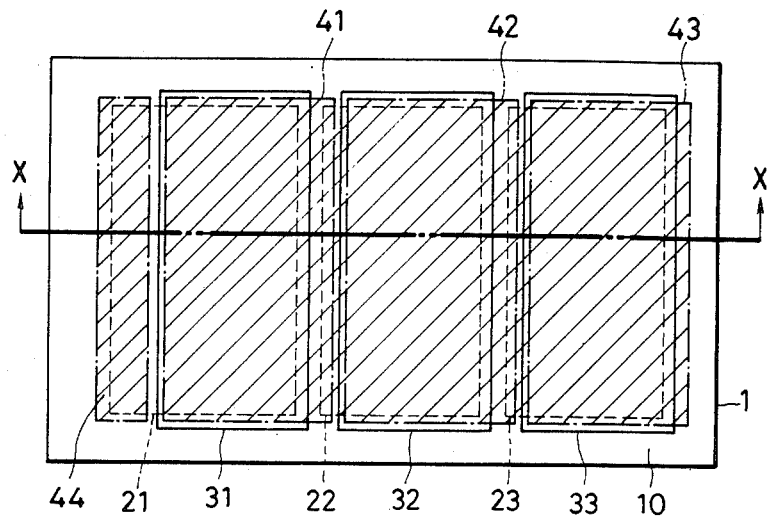
FIG. 1(a) is a plan view and FIG. 1(b) is a cross-sectional view looking in the direction of the arrow X in FIG. 1(a)

Reference will now be made in detail to the preferred embodiments of the invention, an example of which is illustrated in the accompanying drawings. Where appropriate, like numerals have been used throughout the drawings to designate like parts. For example, throughout the drawings the number 1 designates a glass substrate; the numbers 11, 12, and 13 designate unit cells; the number 20 designates a transparent conductive film; the numbers 21, 22, and 23 designate transparent electrodes; the number 30 designates an a-Si layer; the numbers 31, 32, and 33 designate a-Si active regions; the number 40 designates a metal film; the numbers 41, 42, and 43 designate metal electrodes; the number 5 designates a thin opaque film; the number 6 designates a marker; and the numbers 71, 72, 73, 74, 75, and 76 designate respective laser scribing lines.

FIGS. 2 and 3 show one embodiment of the present invention. FIG. 2 shows a thin-film solar battery fabricated by the process of the present invention. FIG. 2(a) is a plan view, while FIGS. 2(b), 2(c), and 2(d) are cross-sectional views looking in the direction of the arrows A, B, and C of FIG. 2(a), respectively. FIGS. 3(a) through 3(f) illustrate the steps of fabricating the interconnected solar cells according to one embodiment of the present invention.

Figure 3A:
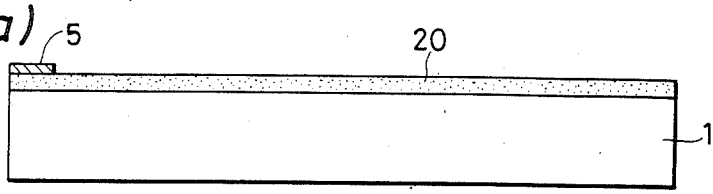
FIG. 3 shows cross-sectional views 3(a), 3(b), 3(c), 3(d), 3(e) and 3(f) illustrating the sequence of the steps taken to fabricate a solar battery in accordance with one embodiment of the invention, with the individual cross-sectional views being taken through the unit cells and the markers.

First, as shown in FIG. 3(a), a transparent conductive film 20 which is made of ITO, $SnO_2$, or a laminate thereof is deposited over the entire surface of a glass substrate 1, and a thin opaque film 5 is formed at two corners of the deposited film 20. The opaque film 5 is formed by evaporation of Cr, Mo, W, or the like to a thickness of 500–2,000 A. The thinner the film, the better, but it must have a light absorbance of no greater than 30%. In order to produce a solar battery having a large effective area, the dimensions of the opaque area 5 are preferably minimized, and area 5 preferably is formed within about 2–3 mm. from the edges of the substrate 1.

As an alternative, the opaque area may be formed by reducing the transparent conductive film rather than by depositing a thin opaque film. Reduction of the transparent conductive film may proceed as follows: all the areas other than the one where the opaque portion is to be formed are covered with a resist film (e.g., AZ111 of Shipley Company Inc., U.S.A.). Then, the entire surface of the transparent conductive film is dusted with zinc powder and treated with a reducing solution (e.g., ATO-Etch II of Min Etch Corporation, USA) to dissolve In and Sb out of the transparent film. This method provides an opaque film having an absorbance of 5%.

Figure 1B:
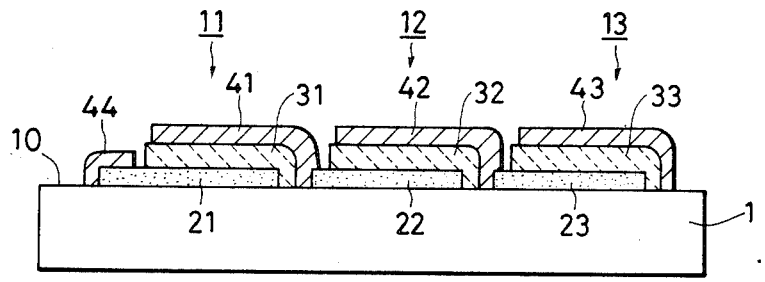
Figure 2A:
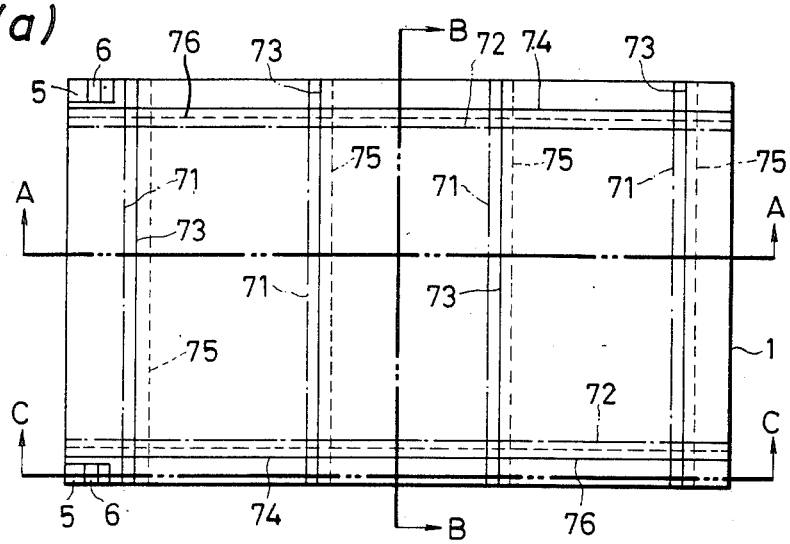
FIG. 2(a), is a plan view
Figure 2B:
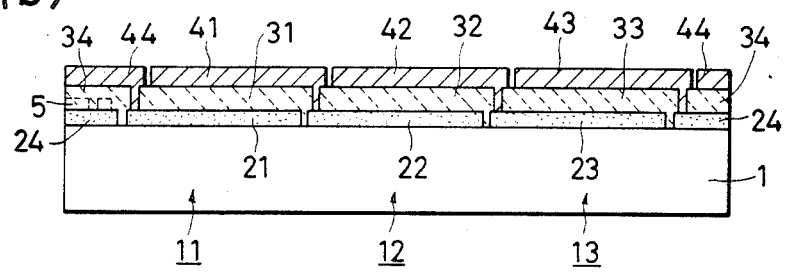
FIG. 2(b), 2(c), and 2(d) are cross-sectional views looking in the directions of the arrows A, B, and C in FIG. 2(a) respectively.
Figure 2C:
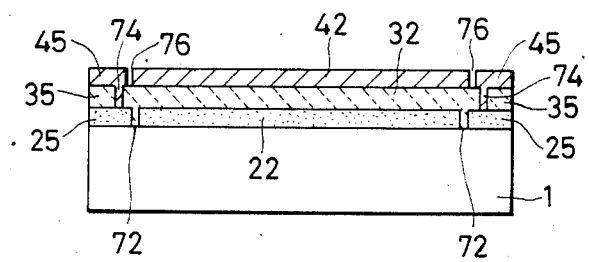
Figure 2D:
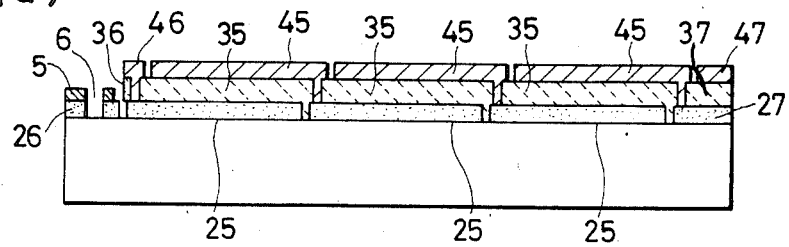
Figure 3B:
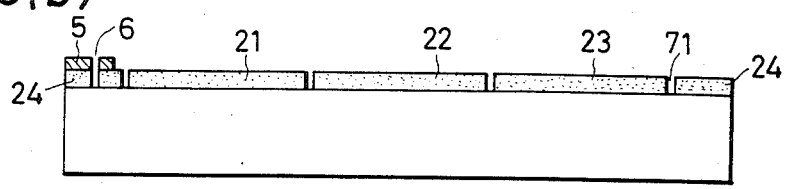

As a next step, the transparent conductive film 20 is then scribed into strips by a YAG laser radiating a beam spot of 60 μm at a power of 4–8 watts and a pulse duration of 300 nanoseconds in a single mode ($TEM_{oo}$) with a pulse rate of 30 kilohertz. The lines along which the film is scribed are indicated by one-short-and-one-long dashed lines 71 and 72 shown in FIG. 2(a). As shown in FIG. 3(b), transparent electrodes 21, 22, and 23 are formed in the same patterns as illustrated in FIG. 1, together with the surrounding transparent conductive film regions 24, 25, 26, and 27 shown in FIG. 2. The thin opaque film 5 in the region 26 is similarly laser scribed to form a cross-shaped marker 6, as shown in FIG. 2(a).

Figure 3C:
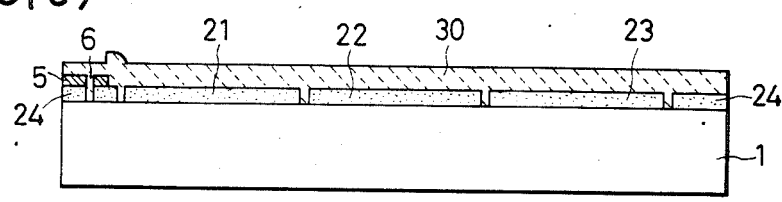

In the next step, an a-Si layer 30 having a pin junction is formed as shown in FIG. 3(c), provided that the area of about 3 mm square including the marker 6 is covered with a metal mask or any other suitable device so that no a-Si layer will form over the marker 6. The p-type layer, the intrinsic layer and the n-type layer have thicknesses of about 100 A, 0.5 μm, and 500 A, respectively.

Figure 3D:
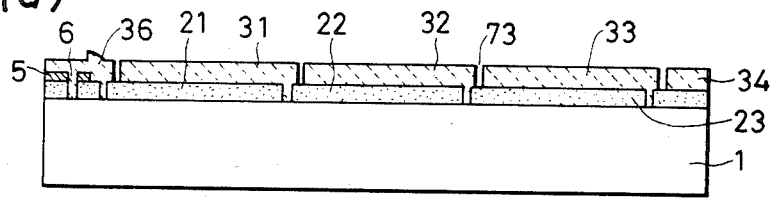

The chip is then set on a laser patterning apparatus, with the markers 6 being used for attaining alignment. The a-Si layer 30 is then scribed with a YAG laser into strips along the solid lines 73 and 74 shown in FIG. 2(a). This provides patterned a-Si active regions 31, 32, and 33 as shown in FIG. 3(d). The laser radiates a beam spot of 60 $\mu m^\phi$ at a power of 1–4 watts in a TEM$_{ooo}$ mode with a pulse of 30 kilohertz. These lasing conditions provide satisfactory results without causing any damage to the transparent electrodes 21, 22, and 23 lying under the a-Si layer. The active regions 31, 32, and 33 are isolated from surrounding regions of a-Si layer 34, 35, 36, and 37, which are sensitive to defect formation.

Figure 3E:
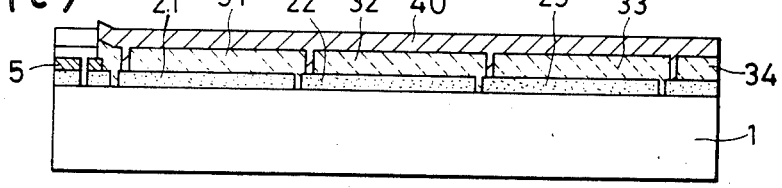
Figure 3F:
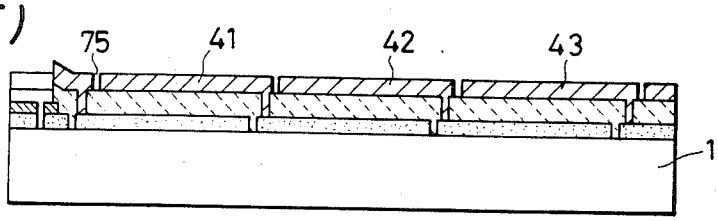

In a similar manner, a metal film 40 made of aluminum, titanium, molybdenum, tungsten, chromium, or the like is formed over the entire surface of the a-Si layer except in the area of about 3 mm square including the marker 6, as shown in FIG. 3(e). Then the chip is set on a laser patterning apparatus with the markers 6 used for alignment purposes. The deposited metal film is laser scribed into strips along the dashed lines 75 and 76 shown in FIG. 2(a), thereby forming metal electrodes 41, 42, and 43 as shown in FIG. 3(f) which are isolated from surrounding regions 44, 45, 46, and 47. The lasing conditions are a beam spot diameter of 60 $\mu m$, a radiating power of 1–3 watts, TEM$_{ooo}$ mode, and a pulsing rate of 30 kilohertz.

Figure 4:
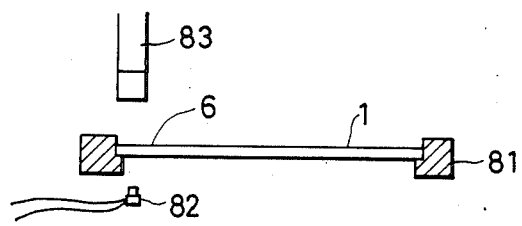
FIG. 4 is a cross-sectional view of a laser patterning apparatus which may be employed in one embodiment of the present invention.

An example of the laster patterning apparatus which may be used in the present invention is shown in FIG. 4. The patterning starts with setting the substrate 1 on a support frame 81 in such a manner that a light-emitting diode 82 is positioned below the marker 6 and a sensor 83 (e.g., TV camera) is positioned above it. In other words, an LED 82 sensor 83 pair is positioned close to each of the two markers 6. Since the markers 6 in the opaque areas 5 are capable of light transmission, alignment can be readily attained by adjusting the support frame 81 such that the cross-shaped pattern of each marker lies on the line connecting the LED 82 and sensor 83. This method of alignment is adaptable to automation.

As a result of these procedures, the metal electrodes 44, 41, and 42 are electrically connected to the transparent electrodes 21, 22, and 23, respectively, as shown in FIG. 2, thereby producing a solar battery wherein the individual unit cells 11, 12, and 13 are connected in series. A preferred embodiment of a solar battery thus fabricated has an open-circuit voltage V$_{oc}$ of 2.64 volts, a short-circuit current J$_{sc}$ of 15 milliamps per square centimeter, a fill factor FF of 0.66, and an efficiency of 8.7%.

In the embodiment shown, no upper layer was formed over the markers 6. Instead, the individual film layers were deposited while masks or similar devices were placed over the markers. Alternatively, the films may be deposited over the entire surface of the substrate including the markers, and the unwanted areas may then be removed by laser scribing.

In accordance with the present invention, laser scribing is employed to separate individual unit cells from each other and to isolate them from the peripheral region which is highly sensitive to the formation of defects. In addition, markers for attaining alignment during the laser scribing of successive layers on the substrate are formed by also using a laser beam to remove selected linear portions of an opaque area formed over or within the transparent conductive film 20 on the transparent substrate. The present invention thereby enables the continuous fabrication of series-connected solar cells without the steps of applying and drying a photoresist film which must be carried out by a batch process. Another advantage of the invention is that alignment of the layers formed on the substrate can be attained to a precision within ±10 $\mu m$, which prevents shorting between the transparent electrode and the metal electrode, thereby ensuring the fabrication of reliable devices. Furthermore, the desired patterns of transparent electrode film, thin semiconductor film, and metal film can be formed within shorter periods because the respective films need be laser scribed along only a limited number of lines.

It will be apparent to those skilled in the art that various modifications and variations can be made in the fabrication method of the present invention without departing from the scope and spirit of the invention. It is intended that the specification and examples be considered as exemplary only, with a true scope and spirit of the invention being indicated by the following claims.

What is claimed is:

1. A process for fabricating a thin-film solar battery having one or more unit cells each having a thin-film semiconductor active region formed over a transparent dielectric substrate and being in contact with a transparent electrode on the substrate side and with a metal electrode on the opposite side, said process comprising the steps of:

depositing a transparent conductive film over one surface of the substrate;

forming an opaque film over a portion of the combined substrate and deposited transparent conductive film remote from the area where the unit cells are to be formed;

scribing with a laser beam the deposited transparent conductive film down to the substrate to form from the transparent conductive film separate transparent electrodes for the respective unit cells inward from said opaque film;

removing selected portions of the opaque area with a laser beam to form light-transmitting markers;

depositing a semiconductor film over the separate transparent electrodes and the surface of the substrate surrounding the electrodes, but not in the area where the markers are formed;

placing the substrate into proper alignment with the aid of the markers;

scribing with a laser beam the deposited semiconductor film down to the transparent conductive film to form from the semiconductor film separate active regions for the respective unit cells;

depositing a metal film over the separate active regions and the surface of the transparent conductive film surrounding the separate active regions, but not in the area where the markers are formed;

placing the substrate into proper alignment with the aid of the markers; and scribing with a laser beam the deposited metal film down to the semiconductor film to form from the metal film separate metal electrodes for the respective unit cells.

2. The process of claim 1 wherein the opaque film is covered with a mask during both the step of depositing the semiconductor film and the step of depositing the metal film.

3. The process of claim 1 wherein both of the steps of placing the substrate into proper alignment include the step of aligning the marker between a light-emitting diode and a light sensor.

4. The process of claim 1 wherein the opaque film is formed by the evaporation of a material selected from the group consisting of Cr, Mo, and W.

5. The process of claim 1 wherein the opaque film has a light absorbance no greater than 30%.

6. The process of claim 1 wherein the opaque film is formed by the reduction of a portion of the transparent conductive film.

* * * * *